(12) United States Patent
Ng et al.

(10) Patent No.: US 10,468,319 B2
(45) Date of Patent: Nov. 5, 2019

(54) LOW-PROFILE ELECTRONIC PACKAGE (71) Applicant: CARSEM (M) SDN. BHD., Ipoh (MY)

(72) Inventors: Yan Shan Ng, Ipoh (MY); Lily Khor, Ipoh (MY)

(73) Assignee: CARSEM (M) SDN. BHD., Ipoh (MY)

( * ) Notice: Subject to any disclaimer, the term of this patent is extended or adjusted under 35 U.S.C. 154(b) by 273 days.

(21) Appl. No.: 15/492,232

(22) Filed: Apr. 20, 2017

(65) Prior Publication Data
US 2018/0150673 A1 May 31, 2018

(30) Foreign Application Priority Data
Nov. 28, 2016 (MY) .......................... PI2016704400

(51) Int. Cl.
*H01L 23/29* (2006.01)
*G06K 9/00* (2006.01)
*G06K 9/20* (2006.01)
*H01L 23/495* (2006.01)
*H01L 23/31* (2006.01)
*H01L 21/56* (2006.01)

(52) U.S. Cl.
CPC .......... *H01L 23/293* (2013.01); *G06K 9/0004* (2013.01); *G06K 9/2018* (2013.01); *H01L 21/561* (2013.01); *H01L 21/568* (2013.01); *H01L 23/3107* (2013.01); *H01L 23/3135* (2013.01); *H01L 23/49551* (2013.01); *H01L 23/49575* (2013.01); *H01L 23/49589* (2013.01); *H01L 2224/40245* (2013.01); *H01L 2224/48091* (2013.01)

(58) Field of Classification Search
CPC ............. H01L 23/293; H01L 23/49575; H01L 23/49551; H01L 21/56; H01L 23/3121; H01L 2224/40245; H01L 2224/48091; H01L 23/49589; G06K 9/2018; G06K 9/0004
See application file for complete search history.

(56) References Cited

U.S. PATENT DOCUMENTS

| | | | | |
|---|---|---|---|---|
| 5,963,629 A * | 10/1999 | Jung | ............... | H04M 1/274575 379/156 |
| 7,772,681 B2 * | 8/2010 | Joshi | ...................... | H01L 24/29 257/666 |
| 2010/0117224 A1 * | 5/2010 | McElrea | ................. | H01L 24/24 257/723 |
| 2016/0224819 A1 * | 8/2016 | Kim | ...................... | G06K 9/0004 |
| 2016/0247009 A1 * | 8/2016 | Lu | ............................. | G06K 9/00 |
| 2016/0358007 A1 * | 12/2016 | Chung | ................... | H01L 24/48 |

* cited by examiner

*Primary Examiner* — Wesley J Tucker
(74) *Attorney, Agent, or Firm* — Kilpatrick Townsend & Stockton LLP (57) ABSTRACT

An electronic package is formed by placing a semiconductor die within an opening in a leadframe and performing a first molding operation. The die is wirebonded to the leadframe and a final encapsulation is performed with a second molding operation.

20 Claims, 8 Drawing Sheets

LOW-PROFILE ELECTRONIC PACKAGE

CROSS-REFERENCES TO OTHER APPLICATIONS

This application claims priority to Malaysian Application No. PI2016704400, filed Nov. 28, 2016, which is referred to and incorporated herein by reference in its entirety.

FIELD

The described embodiments relate generally to electronic packages for semiconductor devices. More particularly, the present embodiments relate to low-profile electronic packages that can be used with wirebonded semiconductor devices that can function as a portion of a fingerprint scanner.

BACKGROUND

Currently there are a wide variety of compact electronic devices that require low-profile electronic components to fit within their continually shrinking enclosures. In some applications the low-profile electronic components house semiconductor devices that employ wirebond-type interconnects. As the electronic devices become more compact, the electronic packages must also become more compact while not sacrificing performance or reliability.

SUMMARY

Some embodiments of the present disclosure relate to low profile wirebonded electronic packages. An electronic package in the form of a quad-flat no lead (QFN) architecture is formed by disposing a semiconductor die within an opening in the leadframe. The die thickness is at least 50 percent of the thickness of the leadframe, making the electronic package low-profile. In further embodiments a very thin and tightly controlled encapsulation layer is formed over an active surface of the die. The tightly controlled encapsulation layer can be useful for applications where the semiconductor die is a fingerprint scanner that requires a highly controlled layer of dielectric material over it.

In some embodiments an electronic component comprises a leadframe having a first surface positioned opposite and separated from a second surface by a leadframe thickness, and at least one aperture extending through the leadframe thickness creating an opening. A semiconductor die having a first face disposed opposite a second face is positioned within the opening. A dielectric material is disposed within the opening and at least partially encapsulates the semiconductor die. An encapsulation layer is disposed on the first surface of the leadframe and a first face of the semiconductor die.

In some embodiments the semiconductor die is disposed within the opening such that the first face is coplanar with the first surface. In various embodiments the dielectric material is coplanar with the first face of the semiconductor die and the first surface of the leadframe. In further embodiments the dielectric material is coplanar with the second surface of the leadframe.

In some embodiments the semiconductor die has a thickness that is 50 percent or greater than the leadframe thickness. In various embodiments the semiconductor die includes a fingerprint sensor with an active sensor array disposed on the first face. In further embodiments the encapsulation layer has a thickness that is less than 100 microns.

In some embodiments a plurality of wirebonds are coupled between the first face of the semiconductor die and the first surface of the leadframe. In various embodiments the wirebonds have a maximum height above the first surface of the leadframe of 50 microns. In further embodiments the leadframe thickness is 0.127 millimeters.

In some embodiments the dielectric material has a different composition than the encapsulation layer. In various embodiments the encapsulation layer has a melt viscosity that is less than a melt viscosity of the dielectric material. In further embodiments the dielectric material includes an epoxy with a mineral-based filler and the dielectric material includes only an epoxy.

In some embodiments the semiconductor die is completely encapsulated by the dielectric material and the encapsulation layer. In various embodiments the entire first face of the semiconductor die is in contact with the encapsulation layer except where wirebonds are bonded to the first face. In further embodiments the entire second face of the semiconductor die is in contact with the dielectric material. In various embodiments the leadframe further includes a plurality of leads surrounding the opening.

In some embodiments an electronic component comprises a semiconductor die having a die thickness and a first face disposed opposite a second face, a first side disposed opposite a second side and a third side disposed opposite a fourth side. A dielectric material is positioned against the second face and the first, second, third and the fourth sides. An encapsulation layer is positioned against the first face. A plurality of electrically conductive leads are disposed adjacent to at least one of the first, second, third and the fourth sides and electrically isolated from adjacent leads by the dielectric material.

In some embodiments an electronic component comprises an encapsulation layer having an exterior surface opposite an interior surface wherein the exterior surface forms a top surface of the electronic component. A semiconductor die has a first face positioned against the interior surface of the encapsulation layer. A plurality of electrical leads each having a first surface are positioned against the interior surface of the encapsulation layer and are disposed at least partially around a perimeter of the semiconductor die. A layer of dielectric material has a depression positioned on an interior surface and is sized to accommodate the semiconductor die. The layer of dielectric material further comprises an exterior surface forming at least a portion of a bottom surface of the electronic component. In various embodiments the depression has a bottom surface that is in direct contact with the semiconductor die.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Some embodiments of the present disclosure relate to low-profile wirebonded electronic packages. Further embodiments relate to low-profile wirebonded electronic packages that employ a thin layer of dielectric material formed over the die's surface so the die can be used as a sensor. While the present disclosure can be useful for a wide variety of configurations, some embodiments of the disclosure are particularly useful for electronic packages that are used as finger print sensors, as described in more detail below.

For example, in some embodiments an opening is formed in a leadframe and a semiconductor die is positioned within the opening. A dielectric material is formed around the die and the leadframe to secure the components in place. The assembly is then wirebonded and a final, relatively thin encapsulation layer is formed over the die and the leadframe. Since the encapsulation layer is formed separately, it's thickness can be highly controlled such that a thickness of a dielectric material over the semiconductor die can be well-controlled. The well-controlled thickness can be useful in applications where the semiconductor die is a fingerprint scanner.

In order to better appreciate the features and aspects of low-profile wirebonded electronic packages according to the present disclosure, further context for the disclosure is provided in the following section by discussing one particular implementation of an electronic package according to embodiments of the present disclosure. These embodiments are for example only and other embodiments can be employed in other electronic packages such as, but not limited to quad flat no lead (QFN), quad flat packs (QFP), small outline integrated circuits (SOIC) and other electronic package architectures.

Figure 1:
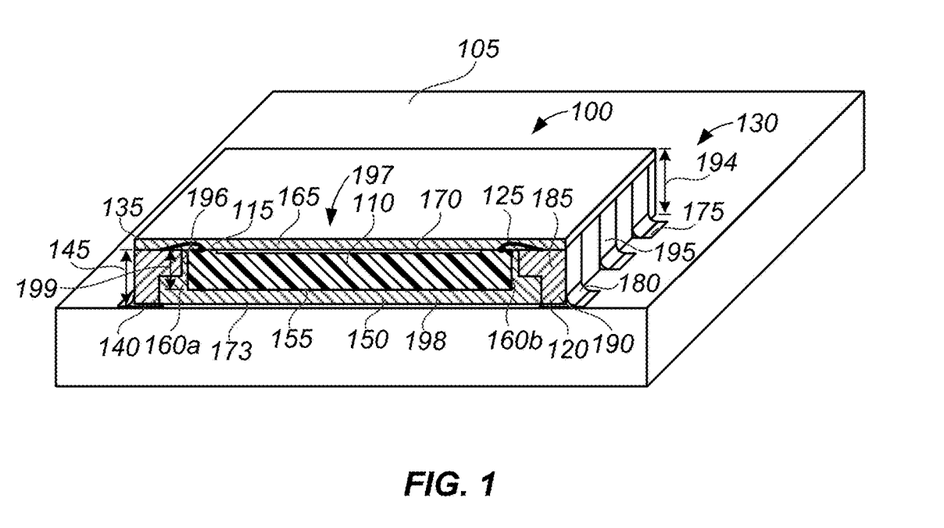
FIG. 1 is a cross-sectional view of a QFN-type electronic package attached to a circuit board, according to some embodiments of the disclosure.

FIG. 1 depicts a cross-sectional view of a QFN-type electronic package 100 attached to a circuit board 105, according to some embodiments of the disclosure. Electronic package 100 includes a semiconductor die 110 having a first face 115 that is coupled to a plurality of leads 120 with one or more wirebonds 125. Each of plurality of leads 120 are formed from a leadframe 130 and has a first surface 135 positioned opposite of and separated from a second surface 140 by a leadframe thickness 145. In some embodiments first face 115 of semiconductor die 110 is coplanar with first surface 135 of plurality of leads 120.

A dielectric material 150 partially encapsulates semiconductor die 110 and plurality of leads 120, contacting the die on a second face 155 and first, second, third and fourth sides 160a, 160b, 160c, 160d, respectively (only first and second sides 160a, 160b are illustrated in FIG. 1). In some embodiments, dielectric material 150 is formed such that it is coplanar with first and second surfaces, 135, 140, respectively of plurality of leads 120 and is also coplanar with first face 115 of semiconductor die 110. An encapsulation layer 165 is disposed on first surface 135 of plurality of leads 120 and first face 115 of semiconductor die 110 such that it encapsulates one or more wirebonds 125. In some embodiments encapsulation layer 165 is relatively thin to enable a fingerprint sensor 170 located on first face 115 of semiconductor die 110 to read a user's fingerprint through encapsulation layer 165.

Plurality of leads 120 are exposed on a bottom surface 173 of electronic package 100 and electrically coupled to a corresponding plurality of pads 175 on circuit board 105 with an attachment material 180 that can be solder, electrically conductive epoxy or any other electrically conductive material. In some embodiments plurality of leads 120 have an elongated top portion 185 providing room for wirebonding and a bottom portion 190 that can be narrower than the top portion. In some embodiments narrower bottom portion 190 can act as a mold lock, securing plurality of leads 120 within dielectric material 150. In further embodiments elongated top portion 185 can also be used to provide increased bonding area for each of plurality of leads 120 while they are attached to tape during the manufacturing process, discussed in more detail below.

In some embodiments each of plurality of leads 120 has an exterior surface 195 located on an exterior edge of electronic package 100, however in other embodiments dielectric material 150 can substantially encapsulate each of the plurality of leads such that little or no portion of leads are visible on exterior edges of the electronic package.

In some embodiments, an interior edge 196 of plurality of leads 120 defines an aperture 197 that extends through leadframe thickness 145 creating an opening 198 within leadframe 130. Semiconductor die 110 is disposed within opening 198 such that first face 115 of the die is substantially coplanar with first surface 135 of plurality of leads 120. In some embodiments by disposing semiconductor die 110 within opening 198 of leadframe 130, electronic package 100 can be low-profile where a thickness 199 of semiconductor die 110 is 50 percent or greater than leadframe thickness 145 such that the electronic package is less than twice the height of the semiconductor die. In further embodiments semiconductor die 110 can be 60 percent or greater than leadframe thickness 145 while in other embodiments the die can be 70 percent or greater and in some embodiments 80 percent or greater and in yet further embodiments between 90 to 100 percent the leadframe thickness. More specifically, in one embodiment where semiconductor die 110 is 100 percent of leadframe thickness 145, the die and the leadframe are the same thickness so the only height added to electronic package 100 relative to the die is from encapsulation layer 165.

In some embodiments plurality of wirebonds 125 are made from gold, a gold alloy, copper, copper alloy, silver, or other metal or metal alloy. In various embodiments plurality of wirebonds 125 are made from wire that is between 0.012 and 100 microns in diameter and in further embodiments between 0.012 and 50 microns in diameter.

In some embodiments leadframe thickness 145 is between 0.051 and 0.254 millimeters, while in other embodiments it is between 0.0762 and 0.178 millimeters and in some embodiments between 0.102 millimeters and 0.152 millimeters and in one embodiment approximately 0.127 millimeters. In further embodiments leadframe 130 can be made from any metal material including copper and copper-based alloys.

In some embodiments semiconductor die thickness 199 is between 0.051 and 0.254 millimeters, while in other embodiments it is between 0.051 and 0.127 millimeters and in some embodiments between 0.051 millimeters and 0.102 millimeters and in one embodiment approximately it is 0.076 millimeters thick.

In some embodiments encapsulation layer 165 has a thickness between 0.025 and 0.254 millimeters, while in other embodiments it is between 0.025 and 0.178 millimeters and in some embodiments between 0.051 millimeters and 0.102 millimeters and in one embodiment approximately 0.076 millimeters.

In some embodiments a height of plurality of wirebonds 125 above first face 115 of semiconductor die 110 is between 0.025 and 0.254 millimeters, while in other embodiments it is between 0.051 and 0.127 millimeters and in some embodiments between 0.051 millimeters and 0.076 millimeters and in one embodiment approximately 0.051 millimeters.

In some embodiments electronic package thickness 194 is between 0.127 and 1.270 millimeters, while in other embodiments it is between 0.127 and 0.635 millimeters and in some embodiments between 0.178 millimeters and 0.381 millimeters and in one embodiment approximately 0.254 millimeters.

In some embodiments dielectric material 150 and encapsulation layer 165 can have different compositions. In one example dielectric material 150 can be configured to have a lower melt viscosity (e.g., spiral flow rating) than encapsulation layer 165 so the dielectric material flows easier with less resistance during the molding process. In some embodiments dielectric material 150 can comprise an epoxy with a mineral-based filler while encapsulation layer 165 can comprise only an epoxy material. In another embodiment both dielectric material 150 and encapsulation layer 165 can comprise an epoxy with a mineral-based filler, however encapsulation layer can have a lower percentage of mineral-based filler material than the dielectric material such that it has a lower melt viscosity. In further embodiments dielectric material 150 can have the same composition as encapsulation layer 165.

In some embodiments semiconductor die 110 is completely encapsulated by a combination of dielectric material 150 and encapsulation layer 165. More specifically, in one embodiment there is no die attach epoxy used within electronic package 100 and semiconductor die 110 is only in contact with dielectric material 150 and encapsulation layer 165. Such embodiments can result in improved moisture sensitivity level (MSL) performance of electronic package 100 since die attach adhesives can be hygroscopic and can result in moisture absorption and failure of the electronic package. Further, the absence of a die attach epoxy can result in cost and manufacturing efficiency savings since the die attach dispense and cure processes are not necessary.

Figure 2:
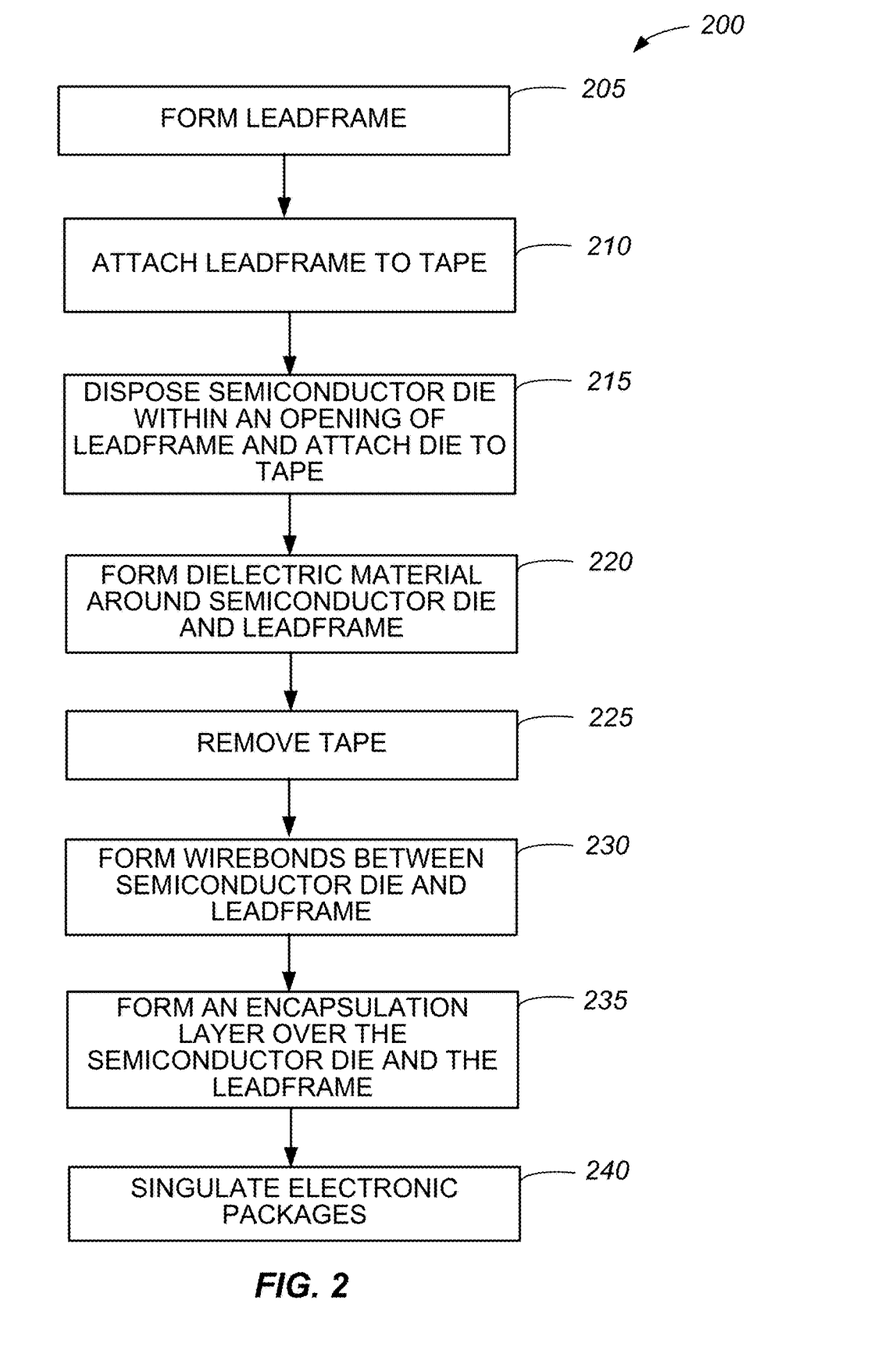
FIG. 2 is a simplified manufacturing process for the low-profile wirebonded package illustrated in FIG. 1.

Now referring to FIG. 2 a simplified manufacturing process 200 for a low-profile wirebonded package is illustrated. FIGS. 3A-3E illustrate sequential cross-sectional views of a singular electronic package 100 during manufacturing process 200. FIGS. 3A-3E illustrate sequential plan views of a panel of four electronic packages 100 during manufacturing process 200. FIGS. 2-4E will now be referred to simultaneously to illustrate one example manufacturing process for electronic package 100.

Figure 3A:
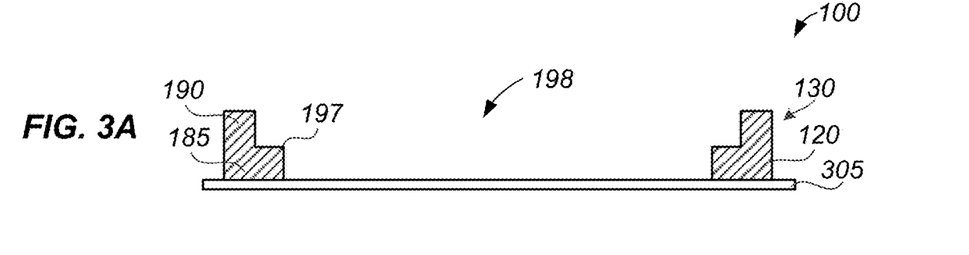
FIGS. 3A-3E are sequential cross-sectional views of the electronic package illustrated in FIG. 1 during the manufacturing process described in FIG. 2.
Figure 4A:
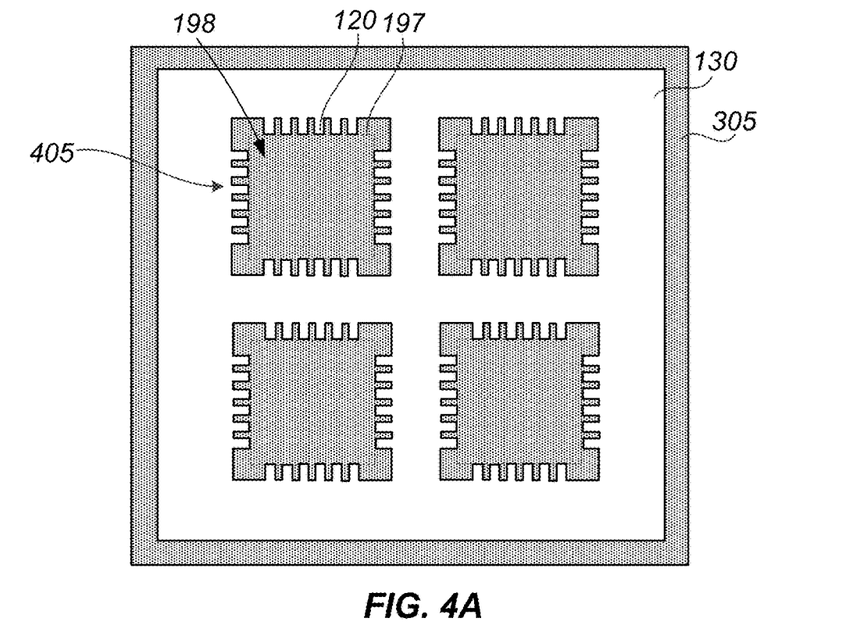
FIGS. 4A-4E are sequential plan views of the electronic package illustrated in FIG. 1 during the manufacturing process described in FIG. 2.

Manufacturing process 200 starts with forming a leadframe in step 205. As illustrated in FIGS. 3A and 4A, leadframe 130 can be formed from a planar panel. In some embodiments leadframe 130 can be a single sheet of metal made from copper or copper-based alloys. Leadframe 130 can have one or more features formed within it. As illustrated in FIG. 4A, four identical patterns 405 have been formed in leadframe 130, creating plurality of leads 120 and opening 198 that is defined by aperture 197. As illustrated in FIG. 3A, leadframe features can have different profiles where each lead of the plurality of leads 120 has an elongated top portion 185 and a narrower bottom portion 190. In some embodiments leadframe 130 can be manufactured with a chemical etching process that includes a half etch performed from either side while in other embodiments it can be manufactured with a stamping process that can include forming and/or coining processes. In further embodiments a combination of etching, stamping and forming/coining processes can be used.

Now advancing to step 210 in process 200 illustrated in FIG. 2, the leadframe is attached to tape. FIG. 3A illustrates tape 305 adhered to each of plurality of leads 120. FIG. 4A illustrates tape 305 attached to entire leadframe 130. In some embodiments tape 305 can have an adhesive that holds leadframe 130 in place and in further embodiments the adhesive can be of a particular composition that is released with exposure to ultra-violet light.

Figure 3B:
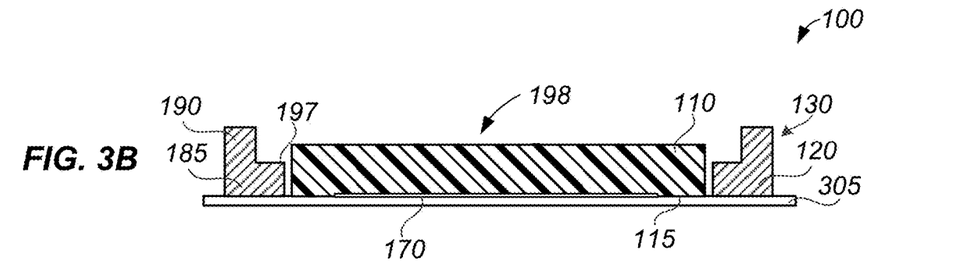
Figure 4B:
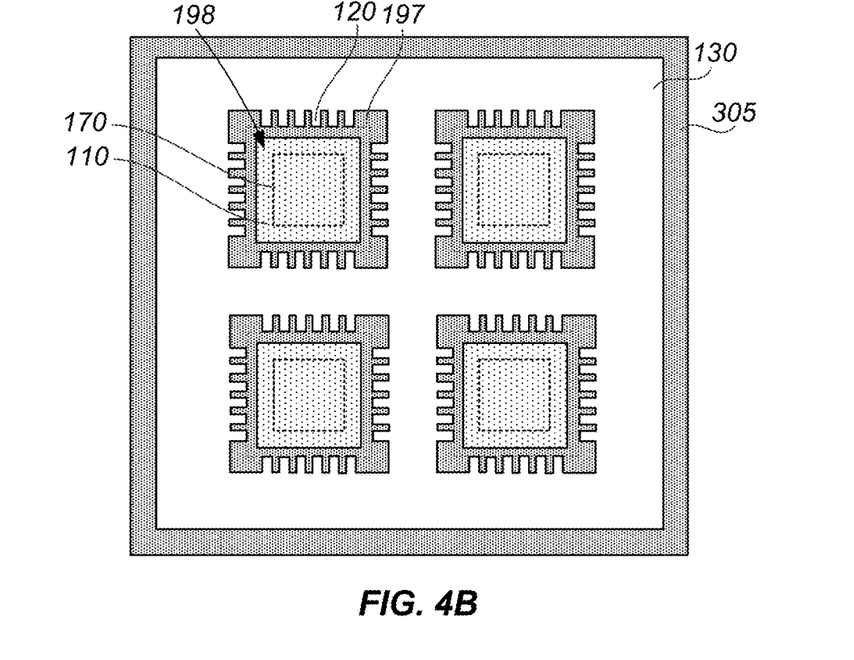

Now advancing to step 215 in process 200 illustrated in FIG. 2, the semiconductor die is disposed within an opening with in the leadframe and the die is also attached to the tape. FIG. 3B illustrates semiconductor die 110 disposed within opening 198 and attached to tape 305. Since leadframe 130 and semiconductor die 110 are both attached to tape 305 they are coplanar at their respective interfaces to the tape. As further illustrated in FIG. 3B, the semiconductor die thickness is greater than 50 percent of the thickness of leadframe 130. Semiconductor die 110 can also have a fingerprint sensor 170 located on first face 115. FIG. 4B shows die 110 placed within opening 198 and also shows that the die is placed with fingerprint sensor 170 and first face 115 down, such that they are in contact with tape 305. Although semiconductor die 110 is illustrated and described as having a fingerprint sensor, it is understood that any semiconductor die can be used within electronic package 100 including and not limited to power devices, digital devices, optical devices and analog devices.

Figure 3C:
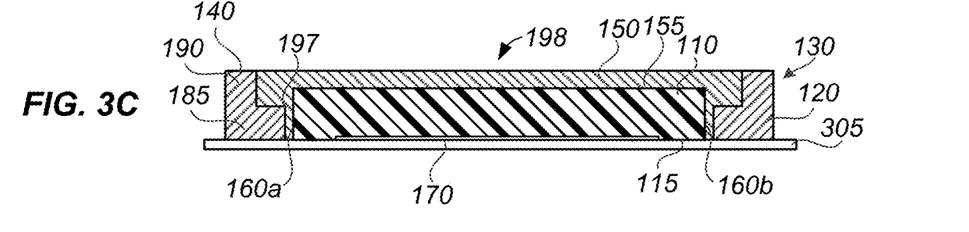
Figure 4C:
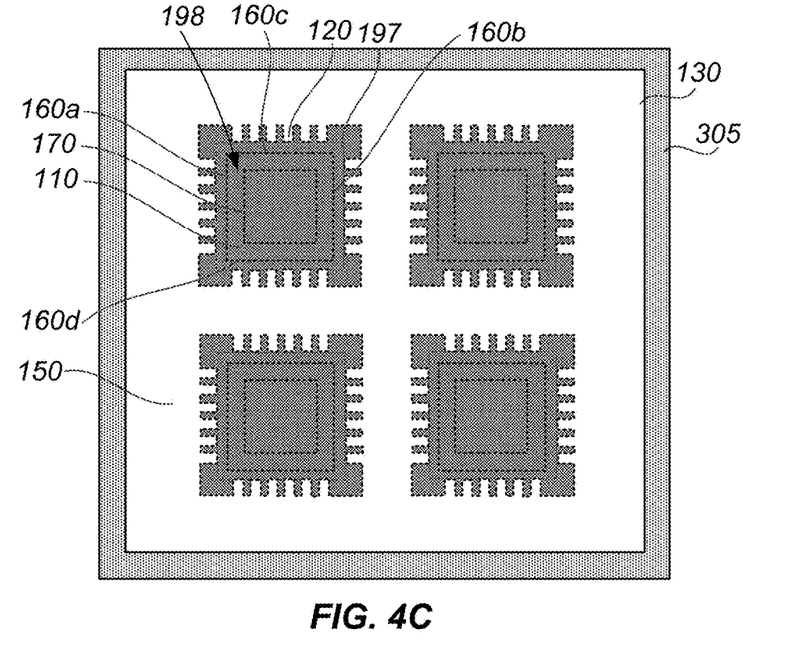

Now advancing to step 220 in process 200 illustrated in FIG. 2, a dielectric material 150 is formed around the semiconductor die and the leadframe. FIG. 3C illustrates dielectric material 150 formed around second face 155 and first and second edges 160*a*, 160*b*, respectively, of semiconductor die 110 such that it is coplanar with second surface 140 of leadframe 130. FIG. 4C illustrates dielectric material 150 formed across a majority of leadframe 130 and around first, second, third and fourth edges 160*a*, 160*b*, 160*c*, 160*d*, respectively of semiconductor die 110. Dielectric material 150 can be formed on leadframe 130 with an injection, mold transfer, dispensing, stencil or other process.

Now advancing to step 225 tape 305 is removed from the leadframe 130. In some embodiments tape 305 is peeled off while in other embodiments it can be exposed to ultraviolet light or a chemical first to make the tape easier to remove.

Figure 3D:
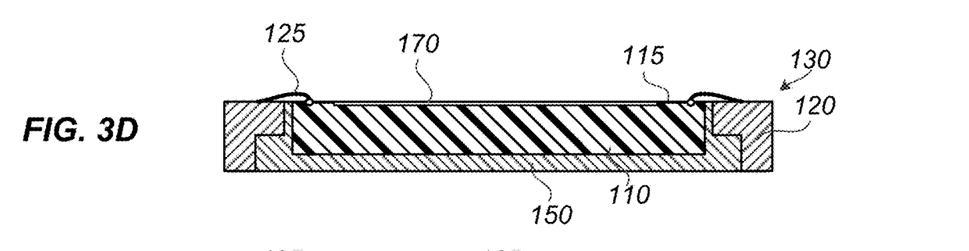
Figure 4D:
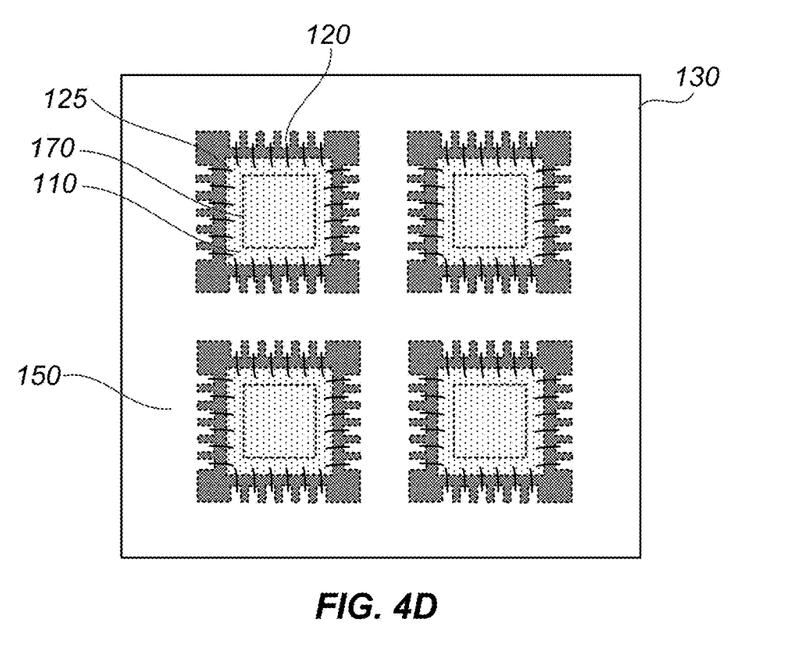
Figure 4E:
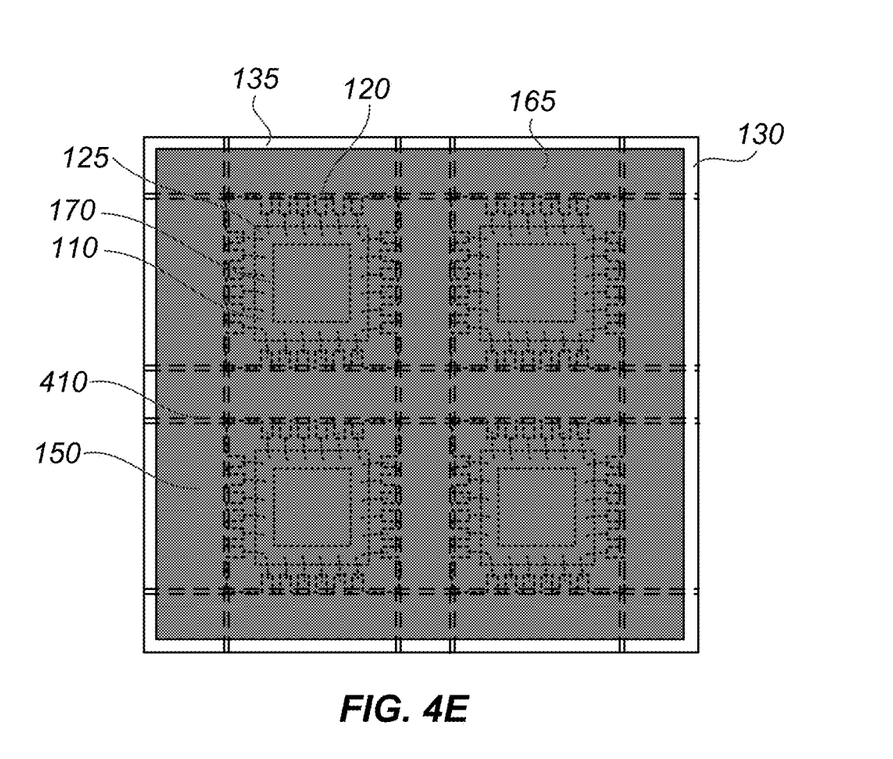

Now advancing to step 230 the electronic package is turned over and wirebonding is performed. FIG. 3D illustrates electronic package 100 inverted with first face 115 of semiconductor die 110 face up. One or more wirebonds 125 couple first face 115 to plurality of leads 120. FIG. 4D illustrates one wirebond 125 per lead, however more than one wirebond per lead can be used and different lead configurations can also be used without departing from this disclosure. Other methods of interconnecting semiconductor die 110 to plurality of leads 120 can also be used, some of which are disclosed in more detail below. In some embodiments the use of dielectric material 150 to secure semiconductor die 110 in place can be beneficial as compared to using a die attach material. The use of dielectric material 150 can minimize "die bounce" during wirebonding since the dielectric material can be selected with a higher hardness and/or modulus of elasticity than a typical die attach material. Further, the manufacturing process can be shortened and streamlined since the die attach dispense and cure cycled are not necessary.

Figure 3E:
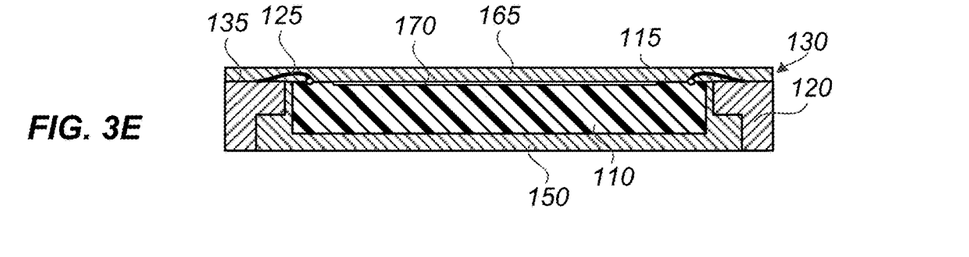

Now advancing to step 235 an encapsulation layer is formed over the semiconductor die and the leadframe. FIG. 3E illustrates encapsulation layer 165 formed over first face 115 of semiconductor die 110 and over first surface 135 of leadframe 130. Encapsulation layer 165 is also shown in FIG. 4D formed across first surface 135 of leadframe 130. In some embodiments the particular sequence of manufacturing steps can enable a relatively tight control of tolerances between first face 115 of semiconductor die 110 and the top outer surface of encapsulation layer 165. Such a process can be beneficial for semiconductor dies that have fingerprint sensors that require a well-controlled thickness of dielectric material between the die and the user's finger.

In various embodiments, by mounting first face 115 of semiconductor die 110 on the same tape as first surface 135 of leadframe 130 the semiconductor die and the leadframe are coplanar. Next, by using a mold tool that registers and seals to first surface 135 of leadframe 130, the tolerance of the mold tool is the only tolerance that factors into the thickness of the encapsulation layer. This allows a very tight control on the thickness of the encapsulation layer 165 between the top of the semiconductor die and the user's finger as well as creating a relatively low-profile electronic package.

Now advancing to step 240 of FIG. 2 electronic packages are singulated, if required. This is shown in detail in FIG. 4E by dashed lines 410 that indicate cut lines through the assembly. In some embodiments singulation can be performed with a dicing saw, a laser, a punch or any other cutting method. Once the cutting is done, the assembly in FIG. 4E will yield four identical electronic packages 100 (see FIG. 1).

The process described above is only for example and other manufacturing processes can be used. In addition, the particular sequence of manufacturing steps above can be performed in any order.

Now referring to FIGS. 5-10 various modifications to electronic package 100 described above can be performed. These modifications can be used alone or in conjunction with one another in any combination.

Figure 5:
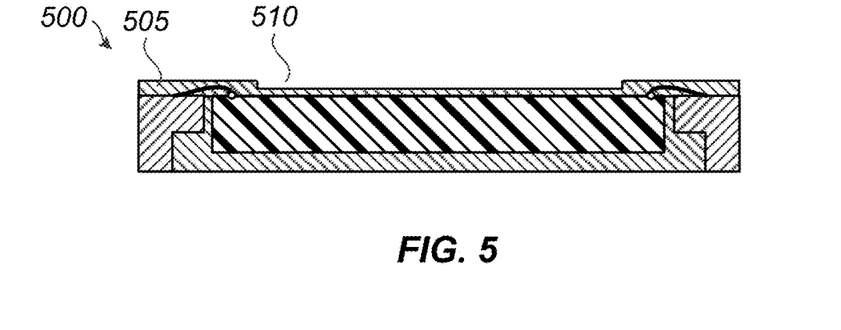
FIG. 5 is a simplified cross-sectional view of an electronic package with an encapsulation layer having a region of reduced thickness according to embodiments of the disclosure.

FIG. 5 illustrates a cross-section of an electronic package 500 with an encapsulation layer 505 having a region 510 of reduced thickness. As shown in FIG. 5, electronic package 500 is similar to electronic package 100, however region 510 of encapsulation layer 505 has a reduced thickness. In some embodiments region 510 can be formed by a protrusion within a molding tool, or by machining or other material removal process. Region 510 can be beneficial for fingerprint sensor dies that require a reduced thickness of dielectric material covering the die.

Figure 6:
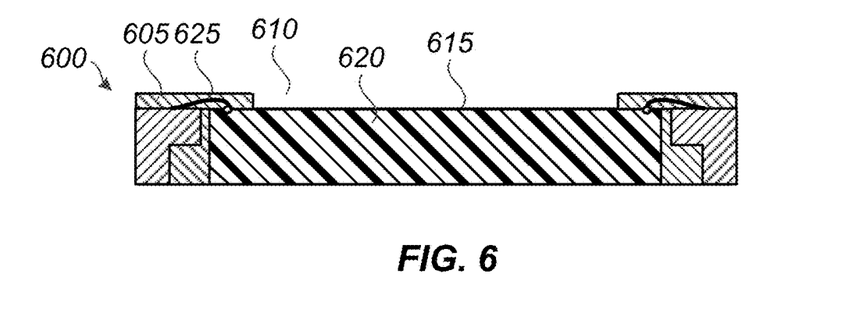
FIG. 6 is a simplified cross-sectional view of an electronic package with an encapsulation layer having an opening that extends through the entire encapsulation layer, according to embodiments of the disclosure.

FIG. 6 illustrates a cross-section of an electronic package 600 with an encapsulation layer 605 having an opening 610 that extends through the entire encapsulation layer such that first face 615 of semiconductor die 620 is exposed. Opening 610 can be formed with a protrusion within a molding tool and in some embodiments the protrusion can be formed from a compressible material such as an elastomer within the molding tool. Therefore, in some embodiments encapsulation layer 605 can be formed in a pattern over first face 615 of semiconductor die 620 and in one embodiment the encapsulation layer can be formed only over regions with wirebonds 625.

Opening 610 can be left open or in some embodiments it can be filled in with another material. In one embodiment the semiconductor die includes a light emitting diode (LED) and opening 610 is filled in with a material that is transparent to the LED wavelength. In another embodiment opening 610 is filled in with a material that is opaque an emits a different wavelength of light than it receives from the semiconductor die (e.g., it emits a white light). In another embodiment semiconductor die 620 can have a heatsink attached directly to it through opening 610. In further embodiments an active electronic component (e.g., a flip chip, a QFP, a QFN), a passive electronic component (e.g., capacitor, resistor or inductor) or other type of electronic device can be electrically coupled to semiconductor die 620 through opening 610. Opening 610 can be used for other features such as, but not limited to, attaching a copper strap as discussed in more detail below.

Figure 7:
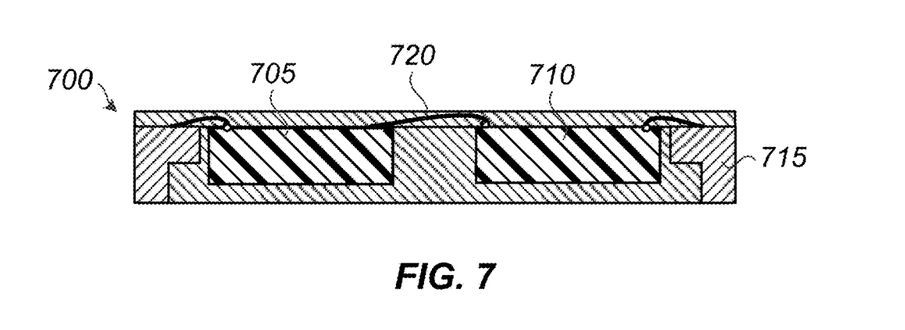
FIG. 7 is a simplified cross-sectional view of an electronic package with multiple dies, according to embodiments of the disclosure.

FIG. 7 illustrates a cross-section of an electronic package 700 with multiple dies. As shown in FIG. 7, electronic package 700 is similar to electronic package 100 (see FIG. 1) however electronic package 700 has two dies 705 and 710. Dies 705 and 710 can be electrically coupled to leads 715 and/or each other with one or more wirebonds 720.

Figure 8:
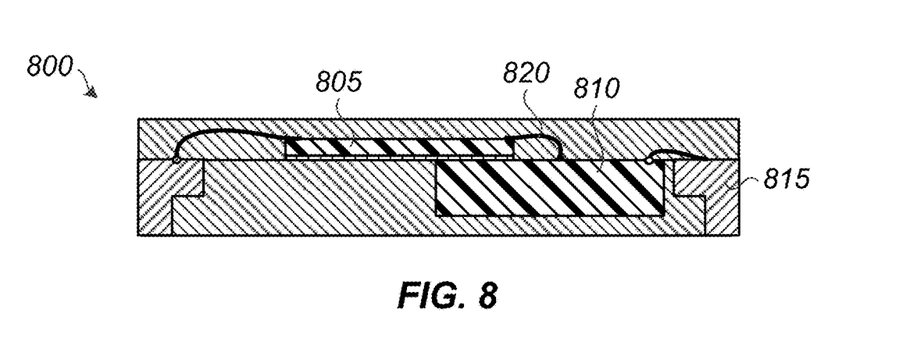
FIG. 8 is a simplified cross-sectional view of an electronic package with multiple dies that are partially overlapping, according to embodiments of the disclosure.

FIG. 8 illustrates a cross-section of an electronic package 800 with multiple dies that are partially overlapping. As shown in FIG. 8, electronic package 800 is similar to electronic package 100 (see FIG. 1) however electronic package 800 has two dies 805 and 810 that are partially overlapping. Dies 805 and 810 can be electrically coupled to leads 815 and/or each other with one or more wirebonds 820.

Figure 9:
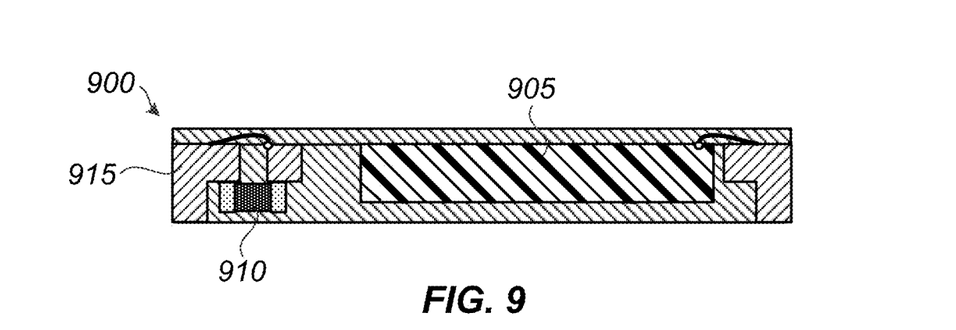
FIG. 9 is a simplified cross-sectional view of an electronic package with a semiconductor die and a passive device, according to embodiments of the disclosure.

FIG. 9 illustrates a cross-section of an electronic package 900 with a both a semiconductor die and a passive device. As shown in FIG. 9, electronic package 900 is similar to electronic package 100 (see FIG. 1) however electronic package 900 has a die 905 and at least one passive device 910. Passive device 910 can be attached between portions of leadframe 915.

Figure 10:
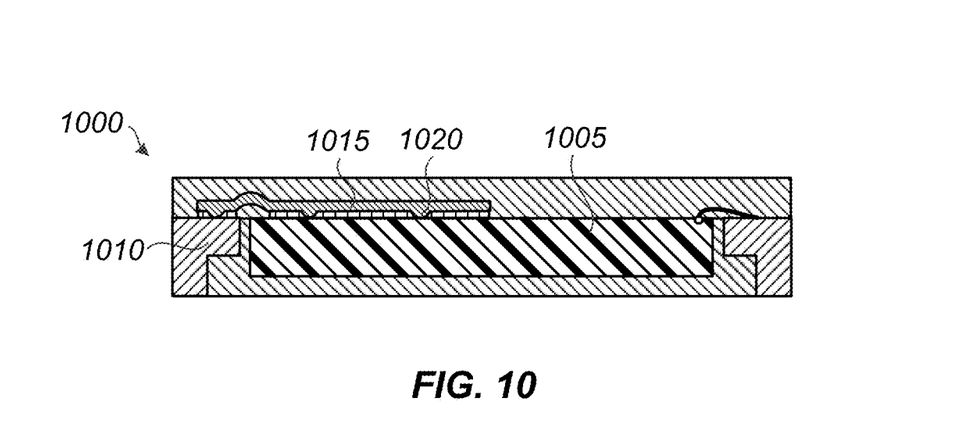
FIG. 10 is a simplified cross-sectional view of an electronic package with a semiconductor die and a strap, according to embodiments of the disclosure.

FIG. 10 illustrates a cross-section of an electronic package 1000 with a semiconductor die that is coupled to one or more leads with a strap. As shown in FIG. 1000, electronic package 1000 is similar to electronic package 100 (see FIG. 1) however electronic package 1000 has a die 1005 that is coupled to one or more leads 1010 with a strap 1015. In some embodiments strap 1015 can have one or more protrusions 1020 to assist in forming a controlled bond line between strap 1015 and semiconductor die 1005. In some embodiments strap 1015 can be made from a metal including copper and/or copper alloys.

Although electronic package 100 (see FIG. 1) is described and illustrated as one particular type of electronic package with one particular type of semiconductor die, embodiments of the disclosure are suitable for use with a multiplicity of electronic package architectures and various semiconductor dies. For example, any electronic packaging architecture can use embodiments of the invention. In some instances, embodiments of the disclosure are particularly well suited for use with portable quad flat packs and SOIC's. In various instances, embodiments of the disclosure are particularly well suited for use with semiconductor devices that are used as fingerprint scanners.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An electronic component comprising:
   a leadframe having a first surface positioned opposite and separated from a second surface by a leadframe thickness, and at least one aperture extending through the leadframe thickness creating an opening;
   a semiconductor die having a first face disposed opposite a second face and positioned within the opening;
   a dielectric material disposed within the opening and at least partially encapsulating the semiconductor die; and
   an encapsulation layer disposed on the first surface of the leadframe and a first face of the semiconductor die.

2. The electronic component of claim 1 wherein the semiconductor die is disposed within the opening such that the first face is coplanar with the first surface.

3. The electronic component of claim 2 wherein the dielectric material is coplanar with the first face of the semiconductor die and the first surface of the leadframe.

4. The electronic component of claim 3 wherein the dielectric material is coplanar with the second surface of the leadframe.

5. The electronic component of claim 1 wherein the semiconductor die has a thickness that is 50 percent or greater than the leadframe thickness.

6. The electronic component of claim 1 wherein the semiconductor die includes a fingerprint sensor with an active sensor array disposed on the first face.

7. The electronic component of claim 6 wherein the encapsulation layer has a thickness that is less than 100 microns.

8. The electronic component of claim 1 wherein a plurality of wirebonds are coupled between the first face of the semiconductor die and the first surface of the leadframe.

9. The electronic component of claim 8 wherein the wirebonds have a maximum height above the first surface of the leadframe of 50 microns.

10. The electronic component of claim 1 wherein the leadframe thickness is 0.127 millimeters.

11. The electronic component of claim 1 wherein the dielectric material has a different composition than the encapsulation layer.

12. The electronic component of claim 1 wherein the encapsulation layer has a melt viscosity that is less than a melt viscosity of the dielectric material.

13. The electronic component of claim 1 wherein the dielectric material includes an epoxy with a mineral-based filler and the dielectric material includes only an epoxy.

14. The electronic component of claim 1 wherein the semiconductor die is completely encapsulated by the dielectric material and the encapsulation layer.

15. The electronic component of claim 14 wherein the entire first face of the semiconductor die is in contact with the encapsulation layer except where wirebonds are bonded to the first face.

16. The electronic component of claim 14 wherein the entire second face of the semiconductor die is in contact with the dielectric material.

17. The electronic component of claim 1 wherein the leadframe further includes a plurality of leads surrounding the opening.

18. An electronic component comprising:
    a semiconductor die having a die thickness and a first face disposed opposite a second face, a first side disposed opposite a second side and a third side disposed opposite a fourth side;
    a dielectric material positioned against the second face and the first, second, third and the fourth sides;
    an encapsulation layer positioned against the first face; and
    a plurality of electrically conductive leads disposed adjacent to at least one of the first, second, third and the fourth sides and electrically isolated from adjacent leads by the dielectric material.

19. An electronic component comprising:
    an encapsulation layer having an exterior surface opposite an interior surface wherein the exterior surface forms a top surface of the electronic component;
    a semiconductor die having a first face positioned against the interior surface of the encapsulation layer;
    a plurality of electrical leads each having a first surface positioned against the interior surface of the encapsulation layer and disposed at least partially around a perimeter of the semiconductor die; and
    a layer of dielectric material having a depression positioned on an interior surface and sized to accommodate the semiconductor die, the layer of dielectric material further comprising an exterior surface forming at least a portion of a bottom surface of the electronic component.

20. The electronic component of claim 19 wherein the depression has a bottom surface that is in direct contact with the semiconductor die.

\* \* \* \* \*